United States Patent [19]
Pfaff

[11] 3,962,719

[45] June 8, 1976

[54] MOUNTING PAD AND SEMICONDUCTOR ENCAPSULATION DEVICE COMBINATION

[75] Inventor: Wayne K. Pfaff, Irving, Tex.

[73] Assignee: Plastronics, Inc., Farmers Branch, Tex.

[22] Filed: Dec. 5, 1974

[21] Appl. No.: 529,727

[52] U.S. Cl. .............................. 357/74; 29/203 R; 174/138 G
[51] Int. Cl.² ........................................ H01L 23/12
[58] Field of Search ............. 174/72 A, 138 G, 146, 174/174, 175; 317/101 C, 101 CC; 24/30.5 S, 115 J, 129 R, 129 B, 129 A, , 129 D, 130, 138 R, 138 A; 339/17 C; 357/74, 80, 85

[56] References Cited
UNITED STATES PATENTS

| | | |
|---|---|---|
| 109,580 | 11/1870 | Bradley et al. .................... 24/138 R |
| 422,651 | 3/1890 | Stanley ........................... 174/175 X |
| 1,639,310 | 8/1927 | Richardson ................ 174/72 A UX |

FOREIGN PATENTS OR APPLICATIONS

| | | |
|---|---|---|
| 1,269,222 | 5/1968 | Germany ....................... 174/138 G |
| 8,199 | 7/1890 | United Kingdom ............... 24/138 R |
| 4,869 | 8/1914 | United Kingdom ............... 24/138 R |

OTHER PUBLICATIONS

Catalogue published by Bivar, Inc., 1500 South Lyon Street, Santa Anna, Calif., copyright 1969, p. 4–1 and p. 5–2b.
Jones, IBM Technical Disclosure Bulletin, "Transistor Spacer," vol. 8, No. 9, Feb. 1966, p. 1298.

*Primary Examiner*—Laramie E. Askin
*Attorney, Agent, or Firm*—Jack A. Kanz

[57] ABSTRACT

Disclosed is a semiconductor mounting pad employing slots into which the leads projecting from a header may be inserted without passing the entire lead through the pad. Apparatus for assembling the mounting pads on standard enclosure devices is also disclosed.

3 Claims, 8 Drawing Figures

MOUNTING PAD AND SEMICONDUCTOR ENCAPSULATION DEVICE COMBINATION

This invention relates to mounting pads for use in connection with semiconductor devices. More particularly, it relates to pads for mounting semiconductor devices on printed circuit boards and the like to space the device from the circuit board, and to methods for positioning and mounting such pads on the leads of semiconductor devices and the like.

In many applications it is desirable to provide space between the base of a semiconductor header or encapsulation device and the circuit board or other apparatus on which the semiconductor device is mounted. For example, a semiconductor element enclosed in a standard TO-5 header may have 3, 4 or even 5 leads projecting from the bottom of the case which must be inserted in holes in the circuit board and thereafter soldered to conductive leads or eyelet patterns in the circuit board. In many cases it is convenient or desirable to provide a certain amount of space between the circuit board and the base of the header to prevent solder bridges from forming on the top side of the board between eyelets or plated-through holes. By spacing the device above the surface of the circuit board on which it is mounted, visual inspection of the top side of the lead-solder joint is permitted. Likewise, spacing the header a short distance from the board allows free air circulation under the semiconductor header to provide cooling of the device, aids in thermally isolating the semiconductor element during soldering, etc.

Conventionally, mounting pads have been used which, in top plan view, approximate the dimensional configurations of the header to which they are to be attached. Accordingly, a pad for a TO-18 or TO-5 header is generally circular in the top plan dimension and has vertical holes passing therethrough; the number and spacing of the holes corresponding to the leads projecting from the header. Therefore the conventional pad may look much like a button. Conventional pads may also have projections from one or both surfaces thereof to aid in spacing the semiconductor device from the mounting board to allow cooling and the like.

It will be observed that mounting pads are not limited to use in connection with devices having a circular header. For example, many rectangular encapsulation devices, such as those used for integrated circuit chips and the like, are conventionally used. Such mounting pads are conventionally formed with top surface dimensions corresponding to the bottom surface dimensions of the encapsulation device and have vertical holes passing therethrough corresponding to the spacing and number of leads projecting from the encapsulation device.

Since conventional mounting pads have holes passing therethrough corresponding in number and location to the leads projecting from the encapsulation device, it will be appreciated that for assembly of the mounting pad under the header, all leads must be first straightened so that the leads will pass through the mounting pad. Conventionally such lead straightening and assembly is done by hand. Obviously a vast amount of manpower and time is consumed in assembly. The process is usually performed by hand simply because it is very difficult to accomplish with automatic machinery.

In accordance with this invention, mounting pads are provided which may be attached to semiconductor encapsulation devices without first straightening the leads. The mounting pad of this invention is essentially a pad having one or more slots therein allowing the pad to be attached to the leads by passing the leads laterally through the slots. Accordingly, the assembly operation can be easily automated, resulting in vast savings of time and manpower. Furthermore, the same pad may accommodate headers having three or more leads since two or more leads may occupy the same slot. Accordingly, one pad design may be used in conjunction with several different configurations of headers. Furthermore, since the pads may be passed laterally over the leads near the base of the header, the leads need not be straightened prior to assembly, thus permitting assembly by simple automated equipment and eliminating various time-consuming hand operations.

Other features and advantages of the invention will become more readily understood from the following detailed description taken in connection with the appended claims and attached drawings in which:

Figure 1:
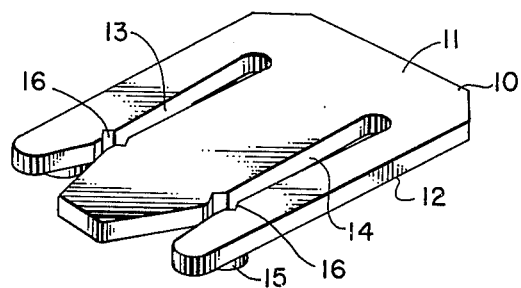
FIG. 1 is a perspective view of the preferred embodiment of the semiconductor mounting pad of the invention.
Figure 2:
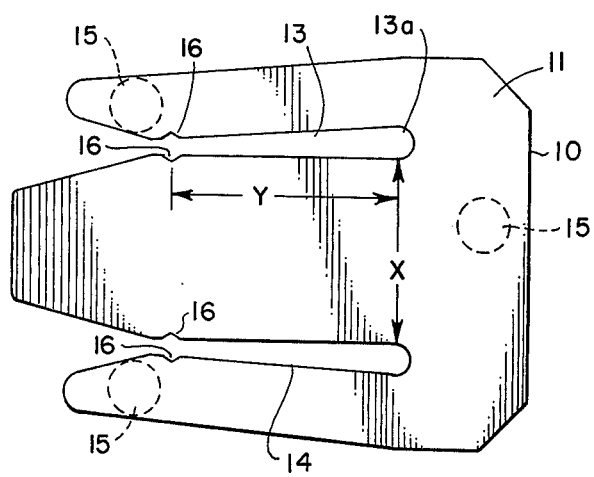
FIG. 2 is a top plan view of the pad shown in FIG. 1.

The preferred configuration for mounting pads formed in accordance with the invention is illustrated in FIGS. 1 and 2. It will be understood that although the device illustrated in the drawings is particularly adapted for use in connection with standard TO-5 and TO-18 headers having 3 or 4 leads, the principles of the invention are equally applicable to other encapsulation devices.

As illustrated in FIG. 1, the pad comprises a substantially rectangular body 10 of electrically non-conductive material such as plastic, alumina or the like. The body is substantially in the form of a flat plate having oppositely disposed major faces 11 and 12. The thickness of the pad may, of course, vary as desired.

Slots 13 and 14 are formed in said body normal to the major faces intersecting only one edge of the body. As illustrated in FIG. 2, slots 13 and 14 are parallel and are of non-uniform width. The slots 13 and 14 are preferably widest at the point where they intersect the edge of the pad to assist in aligning the slots and the leads as will be explained hereinafter. The slots then narrow rapidly to a width slightly less than the width of the leads projecting from the semiconductor encapsulation device, and then gradually expand to a width substantially matching the width of the leads.

Figure 3:
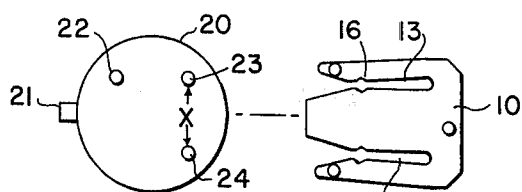
FIG. 3 is a diagrammatical illustration of the manner of assembly of the pad of FIG. 1 on a conventional TO-5 header.
Figure 4:
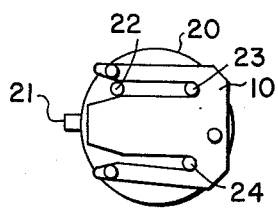
FIG. 4 is a bottom plan view of the complete assembly of FIG. 3.
Figure 5:
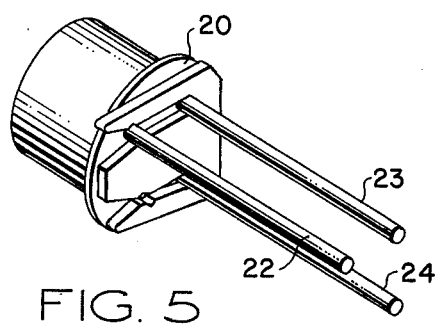
FIG. 5 is a perspective view of the complete assembly of FIG. 4.

Assembly of the mounting pad of the invention on a conventional encapsulation device is illustrated in FIGS. 3, 4 and 5. As illustrated, the header 20 is a conventional TO-5 or TO-18 header which is circular in bottom plan view with an emitter identification tab 21 extending laterally therefrom. Tab 21 is merely used to identify the emitter lead.

As illustrated, the device has only three leads 22, 23 and 24 projecting from the base thereof. The leads are aligned so that leads 22 and 23 may be inserted into slot 13 and the third lead 24 inserted in slot 14. It will be observed that the pad 10 may be mounted on the leads by laterally sliding the pad over the leads near the point where the leads project from the header. Therefore, it is not necessary to straighten the leads since the pad need never pass over the ends of the leads.

As pointed out above, slots 13 and 14 are flared at the opening thereof to allow easy alignment of the slots and the leads. The terminal end of the slot has dimensions substantially corresponding to the thickness of the leads. When the pad 10 is made of resilient material such as plastic or the like, the slots may be of non-uniform diameter, as illustrated in the drawings, so that the portion of the slots intermediate the terminal end and opening is slightly less than the dimensions of the leads. Therefore, as the lead is inserted into the slot, the pad grippingly engages the lead and remains securely affixed thereto. It will be observed that most devices using the TO-5 and TO-18 header have three or four leads. Accordingly, the distance X between the slots 13 and 14 (as illustrated in FIG. 2) should coincide with the distance X between two leads (as illustrated in FIG. 3). Therefore, the same pad configuration may be used for headers using three or four leads. In the first case two leads will occupy one slot and one lead occupy the second slot; while in the second case two leads may occupy each slot. Where more than four leads are used which are not orthogonally arranged, additional slots may be formed in the pad to accommodate leads which may be grouped linearly. Likewise, the same principles may be employed to attach pads of the same general structure to encapsulation devices for integrated circuit chips wherein the leads projecting from the base thereof are arranged in two parallel rows. In such cases the pad may have either two slots arranged parallel lengthwise on the pad or a plurality of slots arranged cross-wise on the pad; each slot accommodating two leads.

Small notches 16 may be formed in one or both side faces of the slots at or near the narrowest portion of the slots. The notches 16 should be spaced from the terminal end 13a by a distance Y which coincides with the spacing between two leads which will occupy the same slot. Therefore, the notches act as a detent to securely lock the pad onto the leads at the desired position.

Legs, such as illustrated at 15 in FIGS. 1 and 2, may be formed on either or both major faces of the pad to space the pad from the circuit board assembly or from the base of the device header as desired. The number, length and size of such legs may vary, of course, as desired to provide the desired spacings.

Figure 7:
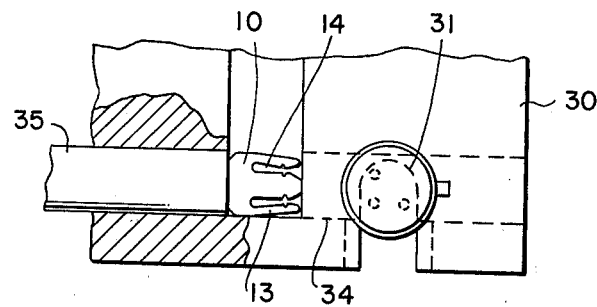
FIG. 7 is a fragmentary view of the apparatus of FIG. 6 illustrating the position of the mounting pad prior to assembly.
Figure 8:
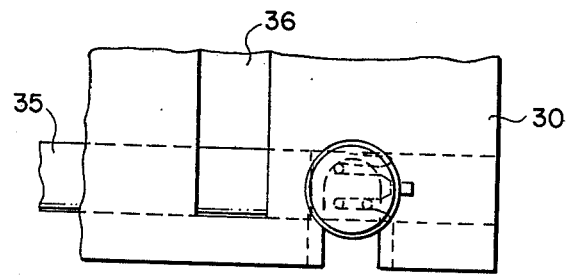
FIG. 8 is a fragmentary view of the apparatus of FIG. 6 illustrating the position of the mounting pad and the plunger apparatus when assembly of the pad and header is complete.

Since the mounting pads of the invention employ slots rather than vertical holes passing therethrough, and since the pads may be attached to the semiconductor device simply by laterally sliding the leads through the slots, assembly of the pad on the semiconductor devices is extremely simplified and may be accomplished by automated apparatus. The preferred embodiment of such automated assembly apparatus is illustrated in FIGS. 6, 7 and 8.

Figure 6:
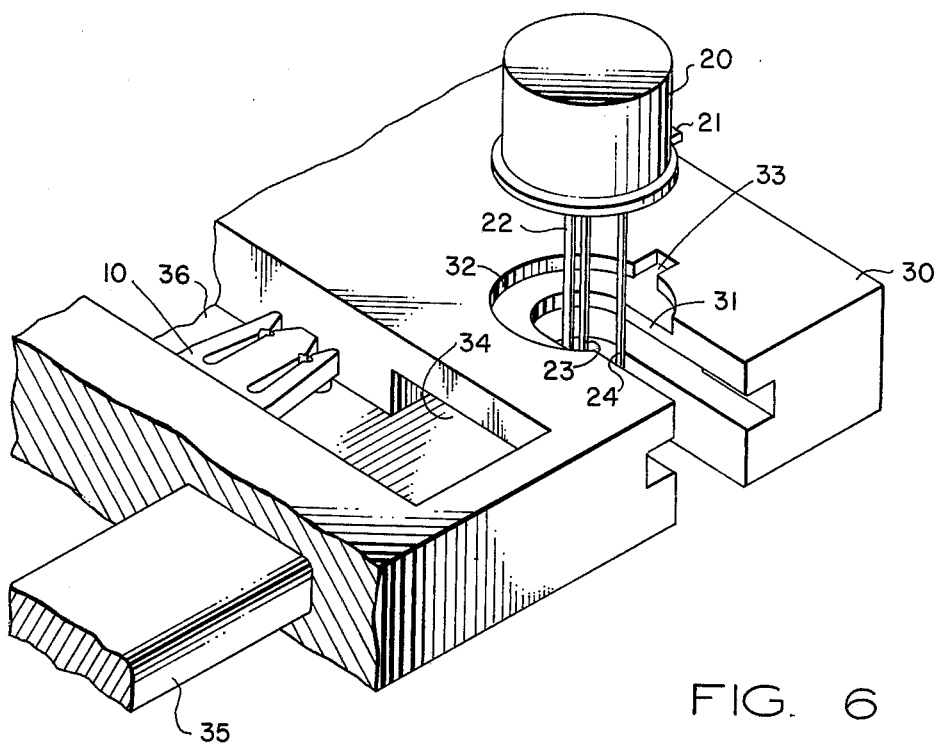
FIG. 6 is a perspective view of an assembly apparatus for automatic positioning of the semiconductor mounting pads of the invention on a standard TO-5 header.

As illustrated in FIG. 6, the preferred apparatus employs a base plate 30 with a vertical hole 31 passing transversely therethrough. Hole 31 is of sufficient diameter to accommodate all of the leads projecting from the base of the header 20. The top portion of hole 31 is expanded to form an annular recess 32. Annular recess 32 is of the same diameter as the base of header 20 and includes an indexing notch 33. The indexing notch 33 is positioned to accommodate emitter tab 21 and thereby automatically align the leads 22, 23 and 24 with the slots in mounting pad 10.

A first channel 34 is formed in the base plate 30 which communicates directly with hole 31 and is of width sufficient to permit the pad 10 to pass therethrough. A plunger 35 is mounted for reciprocal movement in the first channel 34. A second channel 36 is formed in the base plate 30 at right angles to and intersecting the first channel 34. The width of the second channel is only slightly more than the length of the pad 10 to permit the pads 10 to move laterally therethrough until positioned in the first channel 34.

To attach the pad 10 to the leads of header 20, the header is positioned in the recess 32 with the emitter tab 21 fitted in indexing notch 33 and the leads projecting through hole 31. Pad 10 is then moved into the second channel 36 by hand or suitable mechanical means, such as a vibrator or the like, until the pad 10 is aligned with and positioned in first channel 34. Plunger 35 is then moved to the right as illustrated in FIGS. 6, 7 and 8 to force the pad 10 through the first channel and across the hole 31 in the base plate 30. It will be observed that as the pad 10 is moved through the first channel 34, the slots 13 and 14 are aligned with the leads 22, 23 and 24. When the leads are positioned in the slots, the plunger 35 is retracted to allow the next pad to move through second channel 36. The header then is removed with pad 10 attached to the leads projecting therefrom and the operation may be repeated.

It will be readily apparent that the pads of this invention need not be rectangular in shape. However, generally rectangular configuration aids in designing automatic means for aligning the slots for assembly. If desired, the corners of the rectangular pads may be removed so that the outer dimensions of the pad, while still basically rectangular, will substantially conform with the outer dimensions of the headers with which they are employed.

It is to be understood that although the invention has been described with particular reference to specific embodiments thereof, the forms of the invention shown and described in detail are to be taken as the preferred embodiments of same, and that various changes and modifications may be resorted to without departing from the spirit and scope of the invention as defined by the appended claims.

What is claimed is:

1. In combination, a semiconductor encapsulation device having at least two substantially parallel leads projecting from a single face thereof in substantially the same plane and a mounting pad comprising a body of electrically non-conductive material having first and second substantially oppositely disposed major faces and at least one transverse slot therein normal to said major faces traversing a major portion of said major faces and intersecting only one edge of said body, said slot having a non-uniform width, the slot being widest at the point of its intersection with said edge and narrowest at a point intermediate said edge and the terminal end of said slot, the width of said slot generally expanding from the narrowest point to a width substantially matching the width of the leads projecting from the encapsulation device at the terminal end of said slot, said slot further including a notch in at least one side thereof at said narrowest point, and one lead passing through said slot at the terminal end thereof and a second lead passing through said notch.

2. The combination set forth in claim 1 wherein said pad has a second transverse slot substantially parallel with said at least one transverse slot, and at least a third lead projecting from the same face of said encapsulation device passing through said second transverse slot.

3. The combination set forth in claim 1 wherein said pad includes at least one leg extending from at least one of said major faces thereof.

* * * * *